(12) United States Patent
Ainsworth et al.

(10) Patent No.: US 10,210,747 B1
(45) Date of Patent: Feb. 19, 2019

(54) FIRE ALARM TESTING DEVICE AND METHOD

(71) Applicants: Stephen David Ainsworth, Whitby (CA); Mark Douglas Ainsworth, Courtice (CA)

(72) Inventors: Stephen David Ainsworth, Whitby (CA); Mark Douglas Ainsworth, Courtice (CA)

(*) Notice: Subject to any disclaimer, the term of this patent is extended or adjusted under 35 U.S.C. 154(b) by 0 days.

(21) Appl. No.: 15/989,625

(22) Filed: May 25, 2018

(51) Int. Cl.
| | |
|---|---|
| *G08B 29/00* | (2006.01) |
| *G08B 29/14* | (2006.01) |
| *H01H 19/50* | (2006.01) |
| *G01R 31/327* | (2006.01) |
| *G01R 1/04* | (2006.01) |
| *H01H 19/06* | (2006.01) |
| *H01H 19/14* | (2006.01) |

(52) U.S. Cl.
CPC .............. *G08B 29/145* (2013.01); *G01R 1/04* (2013.01); *G01R 31/3277* (2013.01); *H01H 19/50* (2013.01); *H01H 19/06* (2013.01); *H01H 19/14* (2013.01); *H01H 2300/056* (2013.01)

(58) Field of Classification Search
CPC .... G08B 29/145; G01R 1/04; G01R 31/3277; H01H 19/50; H01H 19/06; H01H 19/14; H01H 2300/056
See application file for complete search history.

(56) References Cited

U.S. PATENT DOCUMENTS

| | | | | | |
|---|---|---|---|---|---|
| 3,623,087 | A | * | 11/1971 | Gallichotte | G08B 25/14 340/509 |
| 3,832,678 | A | * | 8/1974 | Gysell | G08B 25/018 340/587 |
| 4,300,132 | A | * | 11/1981 | Arima | H03K 3/354 250/381 |
| 5,705,979 | A | * | 1/1998 | Fierro | G08B 25/04 340/506 |
| 5,796,636 | A | * | 8/1998 | Andrews | H02H 3/335 361/93.2 |
| 6,313,744 | B1 | * | 11/2001 | Capowski | G08B 7/06 340/506 |
| 6,362,743 | B1 | * | 3/2002 | Tanguay | G08B 17/107 250/384 |

(Continued)

*Primary Examiner* — Quang Pham
(74) *Attorney, Agent, or Firm* — Integrity Patent Group, PLC; Charles E. Runyan (57) ABSTRACT

A fire alarm testing device including an electrical-switch assembly, and internal circuitry. The electrical-switch assembly includes a face-plate with the face-plate including two screw-holes, a control knob, two voltage/resistor measuring points, a plurality of electrical contacts, and two mounting screws. The internal circuitry is mechanically and electrically coupleable to the face-plate, and electrically communicable with a fire alarm system. The control knob also includes four rotatable positions including normal, open, ground, and short such that the fire alarm system is testable by rotating the knob. The electrical-switch assembly is rated for 0-40 volts direct current and is rated up to 350 milliamps and is rated up to 3.5 continuous current-amps. Preferably, electrical-switch assembly is water resistant sealed from dust and debris. Protective caps or plugs are installed where required to prevent foreign objects into the device.

18 Claims, 6 Drawing Sheets

(56) References Cited

U.S. PATENT DOCUMENTS

| | | | | |
|---|---|---|---|---|
| 6,769,285 | B2* | 8/2004 | Schneider | G08B 29/145 |
| | | | | 73/1.06 |
| 8,063,763 | B2* | 11/2011 | Barrieau | G08B 29/181 |
| | | | | 340/286.05 |
| 8,373,571 | B2* | 2/2013 | Henson | H02H 9/001 |
| | | | | 340/501 |
| 8,477,042 | B2* | 7/2013 | Henson | G08B 25/04 |
| | | | | 340/501 |
| 9,552,720 | B2* | 1/2017 | Moffa | G08B 29/043 |
| 2002/0008628 | A1* | 1/2002 | Sadjadi | G08B 5/36 |
| | | | | 340/638 |
| 2005/0057367 | A1* | 3/2005 | Regh | G08B 17/10 |
| | | | | 340/693.6 |
| 2007/0001860 | A1* | 1/2007 | Frost-Gaskin | G08B 17/06 |
| | | | | 340/577 |
| 2007/0241876 | A1* | 10/2007 | Johnston | G08B 17/00 |
| | | | | 340/506 |
| 2010/0073175 | A1* | 3/2010 | Lontka | G08B 29/123 |
| | | | | 340/635 |
| 2011/0150188 | A1* | 6/2011 | Buss | G08B 29/123 |
| | | | | 379/27.01 |
| 2013/0106600 | A1* | 5/2013 | Hall | G08B 29/12 |
| | | | | 340/514 |
| 2017/0018383 | A1* | 1/2017 | Herzog | G01R 31/3277 |
| 2017/0093146 | A1* | 3/2017 | Gao | H02H 3/335 |
| 2018/0172529 | A1* | 6/2018 | Seebaluck | G01L 9/0041 |

\* cited by examiner

FIRE ALARM TESTING DEVICE AND METHOD

BACKGROUND OF THE INVENTION

The following includes information that may be useful in understanding the present disclosure. It is not an admission that any of the information provided herein is prior art nor material to the presently described or claimed inventions, nor that any publication or document that is specifically or implicitly referenced is prior art.

TECHNICAL FIELD

The present invention relates generally to the field of electrical communications of existing art and more specifically relates to electrical testing.

RELATED ART

A fire alarm system includes a multitude of devices and/or sensors to detect emergencies and warn individuals through visual and audio appliances when smoke, fire, carbon monoxide may be present. Such alarms may be activated automatically from detectors (e.g., smoke, heat, etc.), or may also be activated by manual fire alarm activation devices such as hand pull stations and/or call points. Alarms may include bells, sounders, and/or horns. Alarms may additionally include speakers and/or strobe lights and may also include messages.

A fire alarm control panel (FACP), fire alarm control unit (FACU), or generally a "fire alarm panel" is the controlling unit of a fire alarm system. The panel receives information from devices designed to detect and report fires, monitors operational integrity, provides for automatic control of equipment, and transmission of information. The fire alarm panel may also supply electrical energy to operate any associated device, notifications, control, transmission, or relay.

U.S. Pat. No. 3,832,678 to Bjorn Gysell, Karl Axel Nilsson, and Gary Nilvid relates to a fire alarm system. The described fire alarm system includes a plurality of individual alarm devices connected to a two-wire electrical loop, each alarm device including a unidirectional current conducting means, a resistive impedance, and a switch adapted to move to an actuated position in response to fire detection. Also included in the loop are a bi-directional voltage source, a passive load having a predetermined value, and a resistive impedance element, also of a predetermined value, with the plurality of alarm devices and the passive load forming one portion of a voltage divider; the other portion of the voltage divider being formed by the resistive impedance element.

A fire alarm signal can be distinguished from all other signals generated by the system, in that under normal operation, the voltage drop across the resistive impedance element is not altered in response to the application of a first polarity voltage and then a second polarity voltage, while in response to the detection of a fire, a switch in an alarm device assumes its actuated position, whereby the voltage drop across the resistive impedance element assumes a first value in response to a first polarity voltage and a second value different from the first value in response to a second polarity voltage. In response to other abnormal conditions, such as ground leakage between the wires of the loop, the potential drop across the resistive impedance element remains the same for both polarity voltage

SUMMARY OF THE INVENTION

In view of the foregoing disadvantages inherent in the known electrical testing art, the present disclosure provides a novel fire alarm testing device and method. The general purpose of the present disclosure, which will be described subsequently in greater detail, is to provide an efficient and effective fire alarm testing device and method.

A fire alarm testing device is disclosed herein. The fire alarm testing device includes an electrical-switch assembly and internal circuitry. The electrical-switch assembly preferably includes a face-plate; with the face-plate including two screw-holes, a control knob, two voltage/resistor measuring points, a plurality of electrical contacts, and two mounting screws. Included are raised molding points proximate to the plurality of electrical contacts intended for the attachment of protective devices to cover and protect the switch and exposed voltage points from water, dust, and foreign objects. These protective devices can be either caps or plugs, or any other suitable cover.

The internal circuitry is mechanically and electrically coupleable to the face-plate, and electrically in communication with a fire alarm system. The internal circuitry includes at least a plurality of terminals; with the plurality of terminals including minimally a positive terminal, a negative terminal, an R-positive terminal, an R-negative terminal, and a ground terminal. Each of the positive terminal and negative terminals are each electrically coupleable to a fire alarm control panel.

Preferably, the control knob also includes four rotatable positions including normal, open, ground, and short, such that the fire alarm system is testable by a user by the user rotating the knob to a desired position indicated on the face plate by N, O, G, and S. Also, the face-plate includes indicia to determine the position of the control knob. The height and a width of the face-plate are each greater than a standard plate, such that when the standard plate is removed and replaced by the fire alarm testing device, the face-plate is configured to conceal damage produced by removing the standard plate. The plate is preferably constructed from fire resistant material with a minimum of a V-0 rating.

The face-plate preferably includes break-away tabs on the vertical sides of the face-plate such that the user may adjust an overall height of the face-plate. Similarly, the face-plate includes break-away tabs on the horizontal sides of the face-plate such that the user may adjust an overall width of the face-plate. Such adjustments are preferably made during installation of the face-plate.

The electrical-switch assembly is preferably rated for 0-40 volts direct current ("DC") and is rated up to 350 milliamps switching current (other ratings may be used as per ULC code). Also, the electrical-switch assembly is rated for up to 3.5 amps continuous current (other ratings may be used as per ULC code). Preferably, the electrical-switch assembly is water resistant sealed from dust and debris. Also, the control knob preferably includes a keyhole, such that a key is required to operate the control knob. In certain embodiments may be 0 to 10 amps 0 to 1000 milliamps 0 to 10 amps continuous current.

According to another embodiment, a method of using a fire alarm testing device is also disclosed herein. The method of using a fire alarm testing device includes a first step, providing a fire alarm testing device and a fire alarm system as disclosed herein; a second step, installing the fire alarm testing device in electrical communication with the fire alarm system; a third step, rotating a control knob of the fire alarm testing device to a pre-desired setting from a normal setting; a fourth step, measuring a predetermined indicia of an output of the fire alarm system via the fire alarm testing device; and a fifth step, returning the control knob of the fire alarm testing device back to the normal setting.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

BRIEF DESCRIPTION OF THE DRAWINGS

The figures which accompany the written portion of this specification illustrate embodiments and methods of use for the present disclosure, a fire alarm testing device and method, constructed and operative according to the teachings of the present disclosure.

The various embodiments of the present invention will hereinafter be described in conjunction with the appended drawings, wherein like designations denote like elements.

DETAILED DESCRIPTION

As discussed above, embodiments of the present disclosure relate to electrical testing and more particularly to a fire alarm testing device and method as used to improve the ease of use of testing fire alarm systems by providing a device that can perform multiple testing modes without the need to remove electrical components.

Generally, the fire alarm testing device is a switch that verifies that the various field devices are connected to the fire alarm panel are sending the correct electrical communication back to the fire alarm control panel. The fire alarm testing device verifies such electrical communication by 1) breaking the electrical communication without the need to remove the fire alarm testing device from the wall, 2) by grounding either the positive or negative side of the existing device without the need to remove the device from the wall, 3) by shorting between the negative and positive, 4) by reading a voltage value, 5) by reading resistor value without the need to remove the device from the wall, 6) by reading loop resistance without the need to remove the device from the wall, and 7) by reading load current without the need to remove the device from the wall, 8) each reading can be performed independent of other readings. The fire alarm testing device can be used for multiple applications and fire alarm configurations.

Referring now more specifically to the drawings by numerals of reference, there is shown in FIGS. 1-4, various views of a fire alarm testing device 100.

Figure 1:
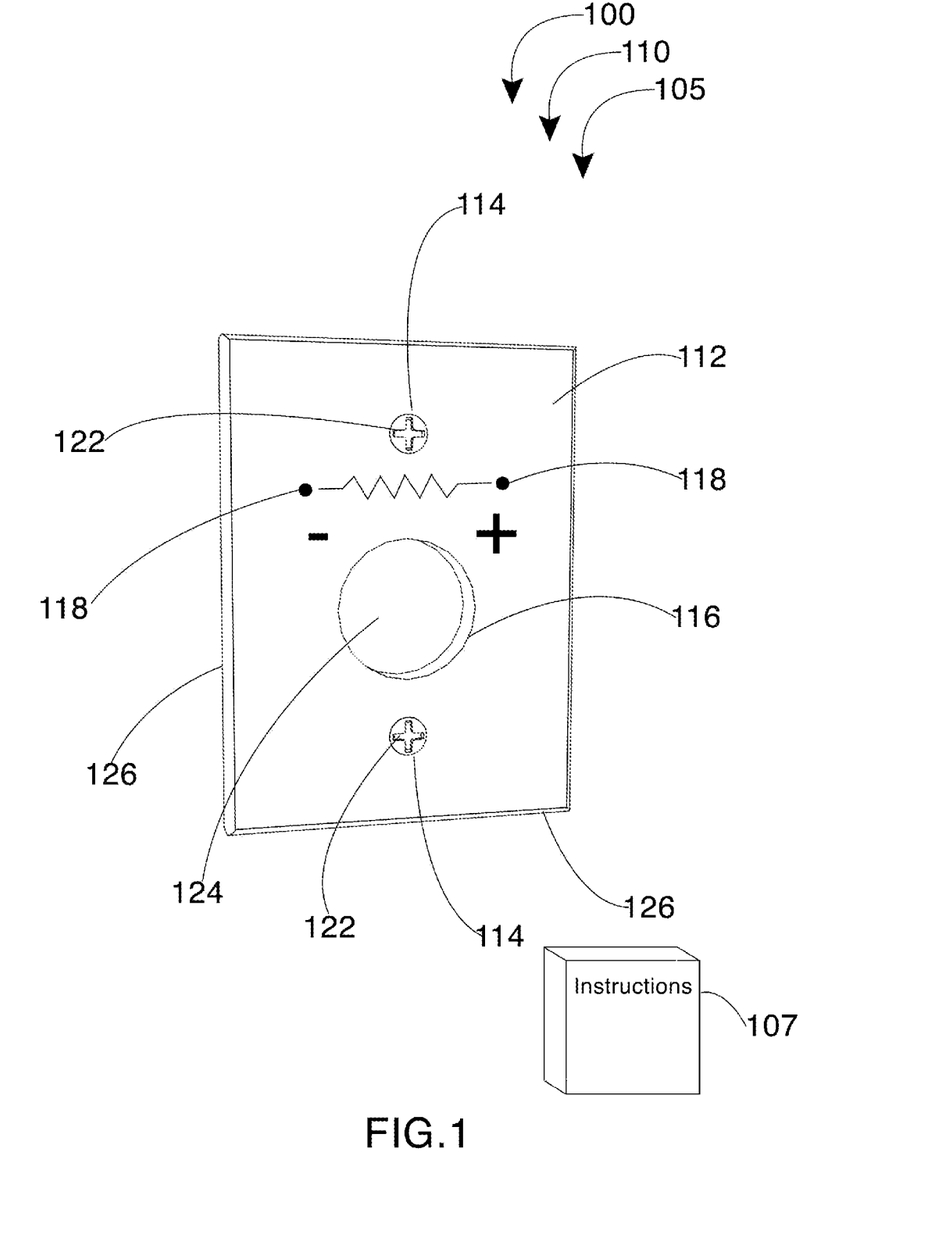
FIG. 1 is a front perspective view of the fire alarm testing device during an 'in-use' condition, according to an embodiment of the disclosure.
Figure 2:
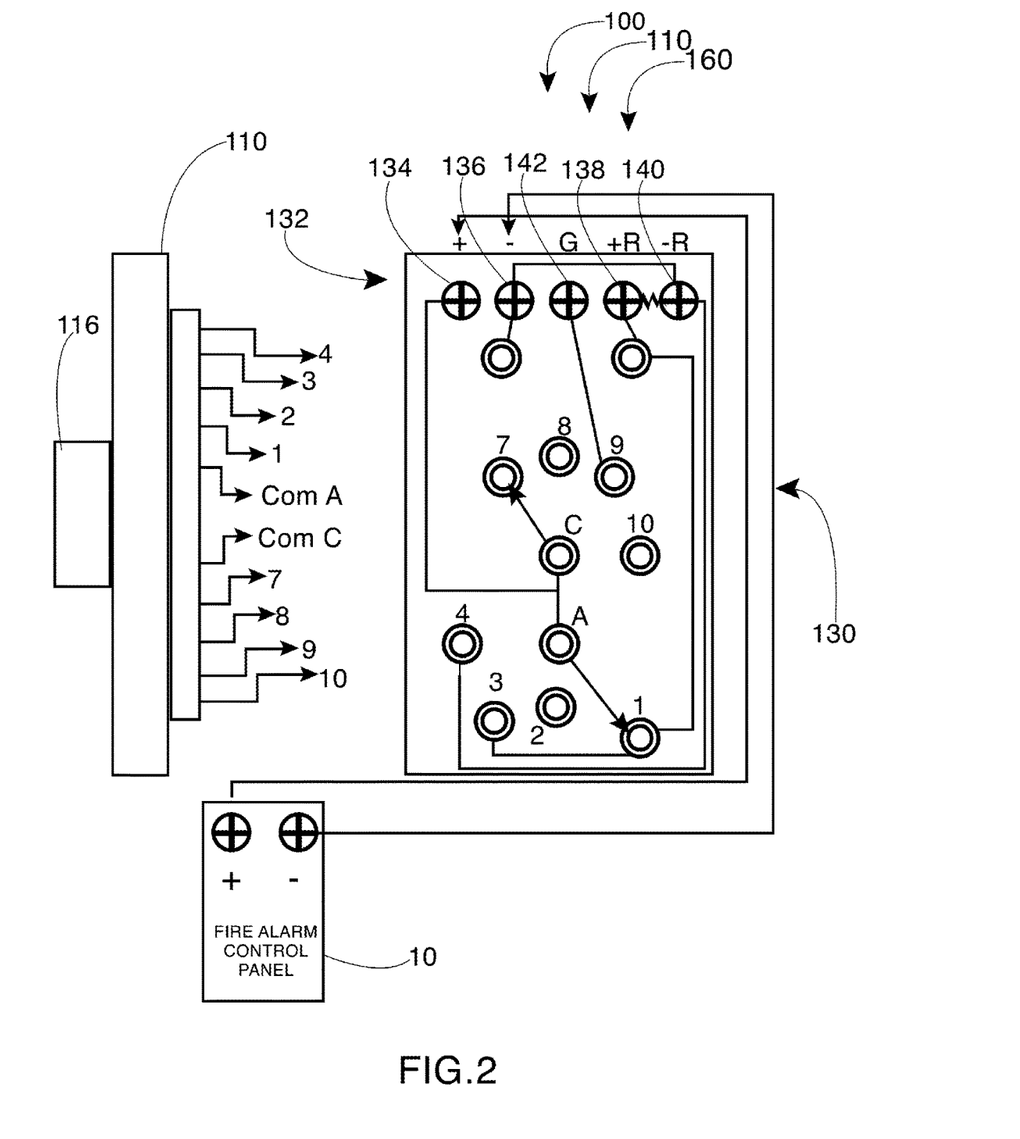
FIG. 2 is a diagram view of the fire alarm testing device of FIG. 1 in the 'normal' position, according to an embodiment of the present disclosure.
Figure 3:
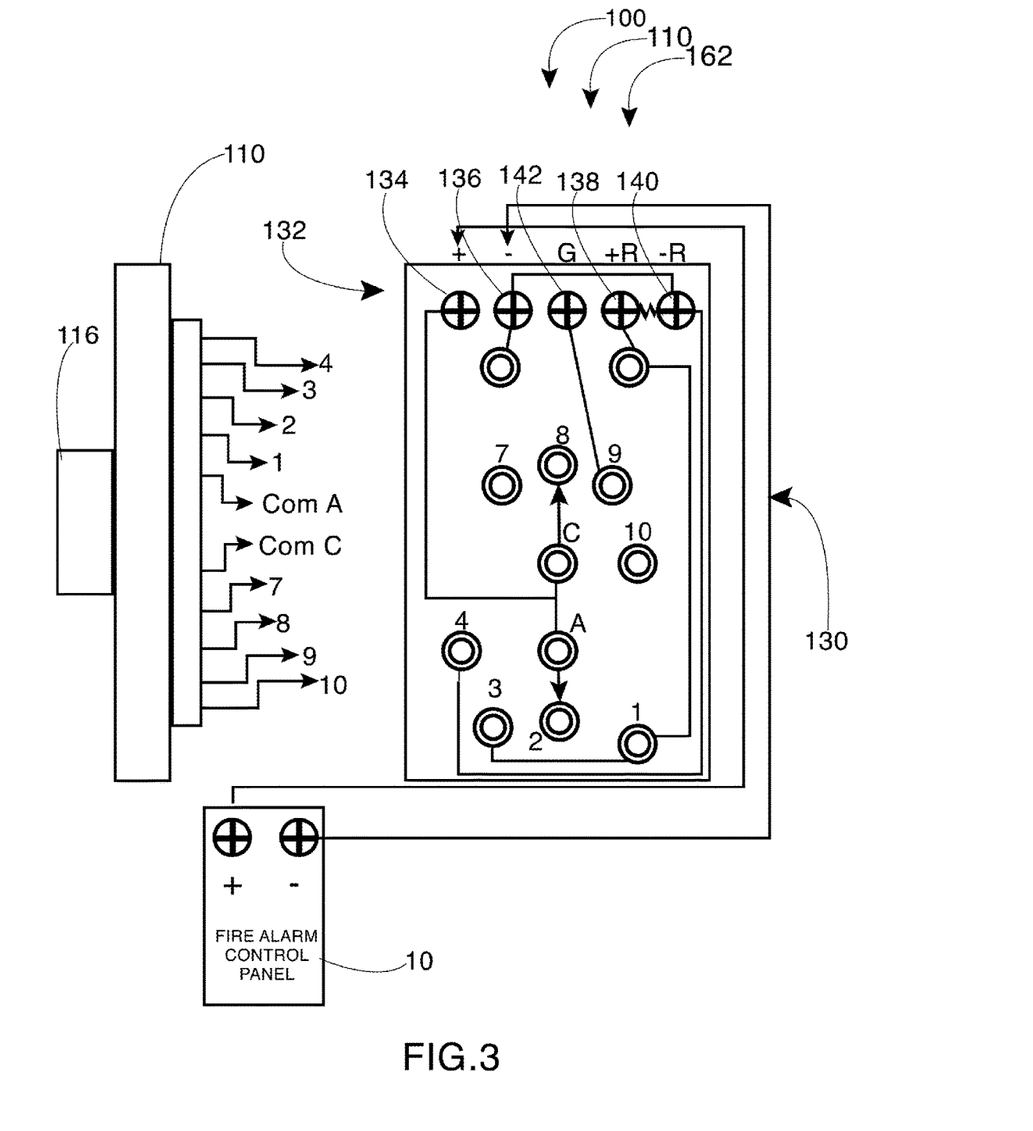
FIG. 3 is a diagram view of the fire alarm testing device of FIG. 1 in the 'open' position, according to an embodiment of the present disclosure.
Figure 4:
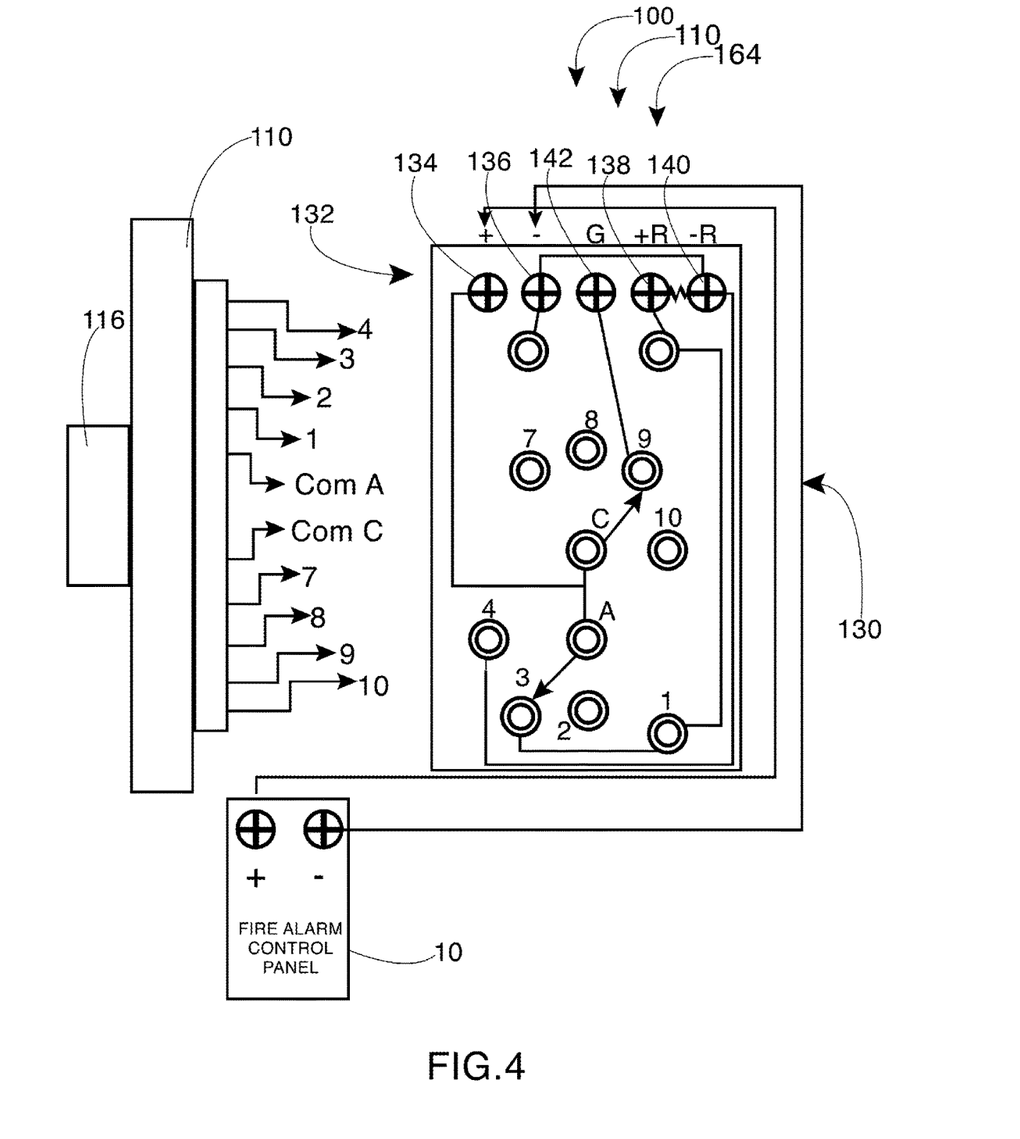
FIG. 4 is a diagram view of the fire alarm testing device of FIG. 1 in the 'ground' position, according to an embodiment of the present disclosure.
Figure 5:
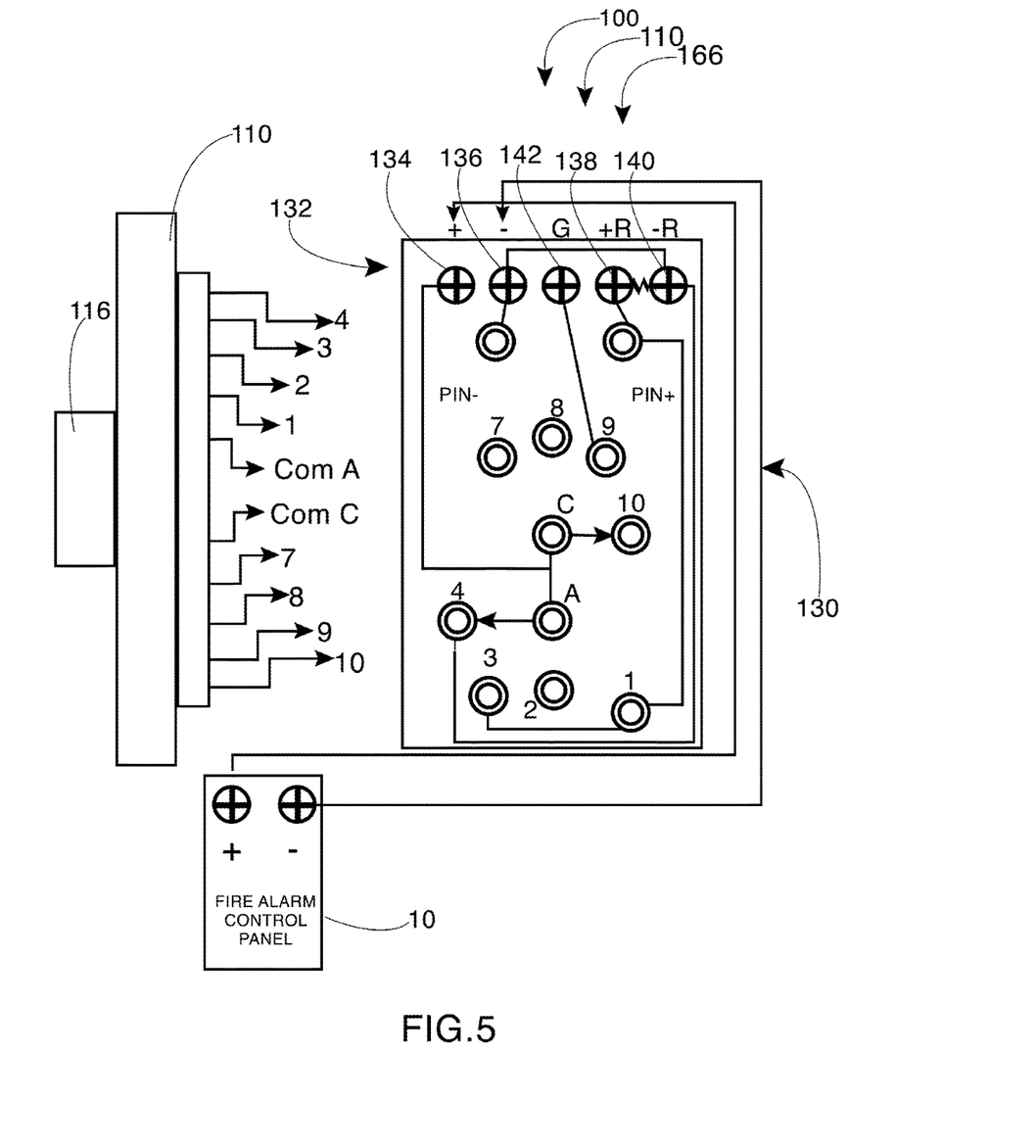
FIG. 5 is a diagram view of the fire alarm testing device of FIG. 1 in the 'short' position, according to an embodiment of the present disclosure.

FIG. 1 shows a fire alarm testing device 100 during an 'in-use' condition, according to an embodiment of the present disclosure. Here, the fire alarm testing device 100 may be beneficial for use by a user to test fire alarm system(s) 10 and components without the need to remove any components.

As generally illustrated in FIGS. 1-5, the fire alarm testing device 100 may include electrical-switch assembly 110; electrical switch assembly 110 may include face-plate 112, where face-plate 112 may include two (or more) screw-holes 114, control knob 116, two voltage/resistor measuring points 118, plurality of electrical contacts, and two (or more) mounting screws 122 which may be electrically grounded. Upon reading this specification, it should be appreciated that, under appropriate circumstances, considering such issues as user preferences, design preference, structural requirements, marketing preferences, cost, available materials, technological advances, etc., other electrical arrangements such as, for example, alternate wiring configurations, etc., may be sufficient.

Also included may be internal circuitry 130; where internal circuitry 130 may be mechanically and electrically coupleable to face-plate 112 and electrically in communication with a fire alarm system 10. Internal circuitry 130 may include a plurality of terminals 132, plurality of terminals including: positive terminal 134, negative terminal 136, R-positive terminal 138, R-negative terminal 140, and ground terminal 142. Positive terminal 134 and negative terminal 136 may each electrically coupleable to a fire alarm control panel. Also included may be a secondary ground terminal (not shown) which may be useful such that ground terminal 142 and/or secondary ground terminal may each be alternately used for testing a positive ground and a negative ground.

Control knob 116 may include four rotatable positions, where four rotatable positions 116 may include normal 160, open 162, ground 164, and short 166, such that the fire alarm system 10 is testable by a user by the user rotating control knob 116 to a desired position. Control knob 116 may include keyhole 124, such that a key is required to operate control knob 116.

Electrical-switch assembly 110 may be rated for 0-40 volts DC, in embodiments. Also, electrical-switch assembly 110 may be rated up to at least 350 milliamps and fire alarm testing device 100 may be rated up to at least 3.5 continuous current-amps. Further, electrical-switch assembly 110 may be water resistant, and electrical-switch assembly 110 may be sealed from dust and debris.

The height and a width of face-plate 112 may be greater than a standard plate, such that when the standard plate is removed and replaced by fire alarm testing device 100 face-plate 112 may conceal damage produced by removing the standard plate. Face-plate 112 may include indicia to determine the position of control knob 116. Face-plate 112 may include break-away tabs on the vertical sides of face-plate 112 such that the user may adjust the overall height of face-plate 112. Similarly, face-plate 112 may include breakaway tabs on the horizontal sides of face-plate 112 such that the user may adjust the overall width of face-plate 112. Face-plate 112 may be constructed from a non-electrically conductive material.

Similar to face-plate 112, control knob 116 may be constructed from a non-electrically conductive material. Face-plate 112 may be removably coupleable to internal circuitry 130. In embodiments, each of two voltage/resistor measuring points 118 may include an aperture. Other embodiments may include each of two voltage/resistor measuring points 118 including an external contact. Also included may be quick release support tabs on the inside of face-plate 112 to allow the removal of electrical-switch assembly 110 and internal circuitry 130 for quick repair, maintenance, and/or replacement.

Those with ordinary skill in the art will now appreciate that upon reading this specification and by their understanding the art of electricity, fire alarms and testing device as described herein, methods of using a fire alarm testing device will be understood by those knowledgeable in such art and is not intended to require memorizing of instructions as to which selection is needed to achieve the test that they are trying to achieve.

According to one embodiment, fire alarm testing device 100 may be arranged as a kit 105. In particular, fire alarm testing device 100 may further include a set of instructions 107. Instructions 107 may detail functional relationships in relation to the structure of fire alarm testing device 100 such that fire alarm testing device 100 can be used, maintained, or the like, in a preferred manner.

Figure 6:
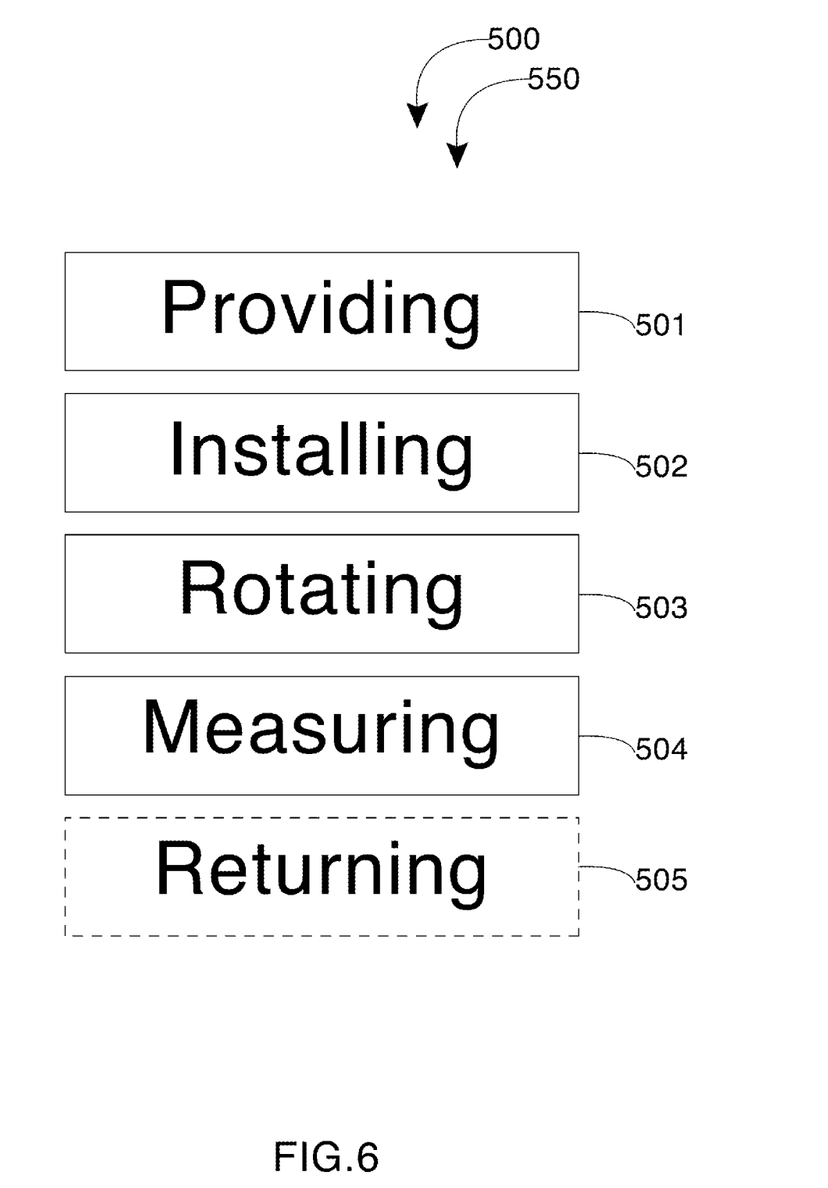
FIG. 6 is a flow diagram illustrating a method of using the fire alarm testing device, according to an embodiment of the present disclosure.

FIG. 6 is a flow diagram illustrating a method of using 500 a fire alarm testing device 100, according to an embodiment of the present disclosure. In particular, method of using 500 a fire alarm testing device 100 may include one or more components or features of the fire alarm testing device 100 as described above. As illustrated, method of using 500 a fire alarm testing device 100 may include the steps of: step one 501, providing fire alarm testing device 100 and fire alarm system 10; step two 502, installing said fire alarm testing device 100 in electrical communication with fire alarm system 10; step three 503, rotating control knob 116 of fire alarm testing device 100 to a pre-desired setting from normal 160 setting; step four 504, measuring a predetermined indicia of an output of fire alarm system 10 via fire alarm testing device 100; and step five 505, returning control knob 116 of fire alarm testing device 100 back to normal 160 setting.

It should be noted that step five 505 is an optional step and may not be implemented in all cases. Optional steps of method of use 500 are illustrated using dashed lines in FIG. 5 so as to distinguish them from the other steps of method of use 500. It should also be noted that the steps described in the method of use can be carried out in many different orders according to user preference. The use of "step of" should not be interpreted as "step for", in the claims herein and is not intended to invoke the provisions of 35 U.S.C. § 112(f). It should also be noted that, under appropriate circumstances, considering such issues as design preference, user preferences, marketing preferences, cost, structural requirements, available materials, technological advances, etc., other method of using a fire alarm testing device(s) (NOTE: e.g., different step orders within above-mentioned list, elimination or addition of certain steps, including or excluding certain maintenance steps, etc.), are taught herein.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

What is claimed is new and desired to be protected by Letters Patent is set forth in the appended claims:

1. A fire alarm testing device, the device comprising:
    an electrical-switch assembly, said electrical-switch assembly including a face-plate with said face-plate including two screw-holes, a control knob, two voltage/resistor measuring points, a plurality of electrical contacts, and two mounting screws, and raised molding points for prevention of water and foreign material from entering the device;
    an internal circuitry, with said internal circuitry mechanically and electrically coupleable to said face-plate and electrically in communication with a fire alarm system, said internal circuitry including a plurality of terminals, said plurality of terminals comprising a positive terminal, a negative terminal, an R-positive terminal, an R-negative terminal, and a ground terminal;
    a plurality of quick release support tabs on the inside to allow the removal of the switch and control board for quick repair or replacement;
    wherein said positive terminal and said negative terminal are each electrically coupleable to a corresponding terminal of a fire alarm control panel;
    wherein said control knob comprises four rotatable positions; and
    wherein said four rotatable positions comprise a normal position, an open position, a ground position, and a short position such that said fire alarm system is testable by a user by said user rotating said control knob to a desired position;
    wherein the normal position connects the positive terminal of the fire alarm control panel to the R-positive terminal and the negative terminal of the fire alarm control panel to the R-negative terminal;
    wherein the open position creates an open circuit between the positive and negative terminals of the fire alarm control panel;
    wherein the ground position connects the positive and negative terminals of the fire alarm control panel to the ground terminal; and
    wherein the short position connects the positive and negative terminals of the fire alarm control panel.

2. The device of claim 1, wherein said electrical-switch assembly is rated for 0-40 volts direct current.

3. The device of claim 1, wherein said electrical-switch assembly is rated up to 350 milliamps and up to 3.5 continuous current-amps.

4. The device of claim 1, wherein said electrical-switch assembly is water resistant.

5. The device of claim 1, wherein said electrical-switch assembly is sealed from dust and debris.

6. The device of claim 1, wherein a height and a width of said face-plate are greater than a standard plate, such that when said standard plate is removed and replaced by said fire alarm testing device said face-plate conceal damage produced by removing said standard plate.

7. The device of claim 1, wherein said control knob includes a keyhole, such that a key is required to operate said control knob.

8. The device of claim 1, wherein said face-plate includes indicia to determine the position of said control knob.

9. The device of claim 1, wherein said face-plate includes break-away tabs on vertical sides of said face-plate such that the user adjusts an overall height of said face-plate.

10. The device of claim 1, wherein said face-plate includes break-away tabs on horizontal sides of said face-plate such that the user adjusts an overall width of said face-plate.

11. The device of claim 1, wherein said face-plate is constructed from a non-electrically conductive material.

12. The device of claim 1, wherein said control knob is constructed from a non-electrically conductive material.

13. The device of claim 1, wherein said face-plate is flame retardant to a min rating of V-0.

14. The device of claim 1, wherein said face-plate is removably coupleable to said internal circuitry.

15. The device of claim 1, each of two voltage/resistor measuring points comprises an aperture.

16. The device of claim 1, each of two voltage/resistor measuring points comprises an external contact.

17. A fire alarm testing device, the device comprising:
- an electrical-switch assembly, said electrical-switch assembly including a faceplate with said face-plate including two screw-holes, a control knob, two voltage/resistor measuring points, a plurality of electrical contacts, and two mounting screws; and
- an internal circuitry, with said internal circuitry mechanically and electrically coupleable to said face-plate and electrically in communication with a fire alarm system, said internal circuitry including a plurality of terminals, said plurality of terminals comprising a positive terminal, a negative terminal, an R-positive terminal, an R-negative terminal, and a ground terminal;
- wherein said positive terminal and said negative terminal are each electrically coupleable to a corresponding terminal of a fire alarm control panel;
- wherein said control knob comprises four rotatable positions;
- wherein said four rotatable positions comprise a normal position, an open position, a ground position, and a short position such that said fire alarm system is testable by a user by said user rotating said knob to a desired position;
- wherein the normal position connects the positive terminal of the fire alarm control panel to the R-positive terminal and the negative terminal of the fire alarm control panel to the R-negative terminal;
- wherein the open position creates an open circuit between the positive and negative terminals of the fire alarm control panel;
- wherein the ground position connects the positive and negative terminals of the fire alarm control panel to the ground terminal;
- wherein the short position connects the positive and negative terminals of the fire alarm control panel;
- wherein said electrical-switch assembly is rated for 0-40 volts direct current;
- wherein said electrical-switch assembly is rated up to at least 350 milliamps;
- wherein said electrical-switch assembly is rated up to at least 3.5 continuous current-amps;
- wherein said electrical-switch assembly is water resistant;
- wherein said electrical-switch assembly is sealed from dust and debris;
- wherein a height and a width of said face-plate are greater than a standard plate, such that when said standard plate is removed and replaced by said fire alarm testing device said face-plate conceal damage produced by removing said standard plate;
- wherein said control knob includes a keyhole, such that a key is required to operate said control knob;
- wherein said face-plate includes indicia to determine a current position of said four rotatable positions of the control knob;
- wherein said face-plate includes break-away tabs on vertical sides of said faceplate such that a user may adjust an overall height of said face-plate; and
- wherein said face-plate includes break-away tabs on horizontal sides of said faceplate such that a user may adjust an overall width of said face-plate.

18. The device of claim 17, further comprising set of instructions; and
wherein the device is arranged as a kit.

* * * * *